United States Patent [19]

Braun et al.

[11] Patent Number: 4,616,235

[45] Date of Patent: Oct. 7, 1986

[54] EXTERNAL ACOUSTIC ABSORBER FOR INK JET PRINTER

[75] Inventors: Hilarion Braun, Beavercreek; Ralph E. Antolik, III, Huberheights, both of Ohio

[73] Assignee: Eastman Kodak Company, Rochester, N.Y.

[21] Appl. No.: 766,231

[22] Filed: Aug. 16, 1985

[51] Int. Cl.[4] .................... G01D 15/18; H01L 41/08; H04R 17/00

[52] U.S. Cl. .................................... 346/75; 310/326; 367/140

[58] Field of Search ................. 346/75; 310/322, 323, 310/326; 367/140, 162, 176

[56] References Cited

U.S. PATENT DOCUMENTS

| | | | |
|---|---|---|---|
| 4,074,277 | 2/1978 | Lane et al. | 346/75 |
| 4,110,759 | 8/1978 | Stoneburner | 346/75 |
| 4,167,742 | 9/1979 | Head et al. | 346/75 |
| 4,354,129 | 10/1982 | Ieki | 310/313 C X |
| 4,528,652 | 7/1985 | Horner et al. | 367/162 |

*Primary Examiner*—E. A. Goldberg
*Assistant Examiner*—Gerald E. Preston
*Attorney, Agent, or Firm*—Dana M. Schmidt

[57] ABSTRACT

There is described an acoustic absorber for an ink jet printer using a waveguide to generate ink drops. The absorber comprises a sheet of elastomer disposed on the orifice plate between the orifice plate and the charge plate of the printer, and a diffuser disposed in contact with the elastomer and between the elastomer and the charge plate, the diffuser having an acoustic impedance of at least $3 \times 10^7$ kg/m$^2$ sec. The length and width of the elastomer sheet and the diffuser are such as to absorb the vibrations from the orifice plate and prevent reflections at the end of the waveguide.

3 Claims, 2 Drawing Figures

EXTERNAL ACOUSTIC ABSORBER FOR INK JET PRINTER

BACKGROUND OF THE INVENTION

Conventional ink jet printers using continuous jet printing feature ink-drop generating means that include an orifice plate connected to a vibrating means, and a waveguide member that supplies ink to the orifice plate and which guides a traveling wave along the orifice plate. Such printers also include a charge plate outside of the orifice plate, that charges appropriate ink drops ejected from the orifice plate. In such a printer, it is desirable that the orifice plate neither (a) transmits vibrations to the charge plate, nor (b) creates reflections in the traveling wave at the ends of the waveguide, which would tend to interfere with the acoustic energy created by the vibrating means.

Several previous methods for achieving these two functions are described in U.S. Pat. No. 4,110,759, issued on Aug. 29, 1978. The exterior space between the orifice plate and the charge plate is limited, since charged drops need to be charged while being detached from the jet emanating from the orifice plate. As a practical matter, the space between orifice plates and charge plates cannot exceed about 635 μm. Thus, such previous methods have involved acoustic absorbers disposed within the waveguide. For example, elastomeric wedges have been formed within the ends of the waveguides, primarily to prevent reflections. Reflections are unwanted because they convert the traveling wave into a standing wave, which causes feedback to the generator and unequal energy levels. Although such acoustic absorbers have had some effectiveness, they are limited in that (a) their size is limited by the dimensions of the waveguide itself, and (b) by being exposed to the ink, the dampening means tends to deteriorate with age, particularly if formed from an elastomer. The latter problem is particularly acute when using solvent inks.

Therefore, there has been a need prior to this invention to improve upon the wave-dampening means heretofore commonly disposed within the waveguide that delivers the ink to the orifice plate.

SUMMARY OF THE INVENTION

This invention is based on the discovery that an effective acoustic absorber can be provided outside of the ink-drop generating means, thereby avoiding the disadvantages of the interior-type acoustic absorbers.

More specifically, there is provided an ink jet printer comprising an orifice plate having a waveguide, a charge plate, an acoustic absorbing means for preventing acoustic reflections from being generated at the ends of the waveguide. This printer is improved in that the acoustic absorbing means comprises (a) a sheet of elastomer disposed outside of and on the orifice plate in a position that is under each end of the waveguide, and between the orifice plate and the charge plate, and (b) a diffuser disposed between the elastomer sheet and the charge plate, in contact only with the elastomer, the diffuser having an acoustic impedance of at least $3\times10^7$ $kg/m^2$ sec, the elastomer sheet and diffuser both having a width and a length that are sufficient to cause the absorbing means to absorb the vibrations and prevent internal reflections.

Thus, it is an advantageous effect of the invention that an acoustic absorber is provided for an ink jet printer that is not limited by the interior dimensions of the ink-drop generator and is not subject to attack by the ink.

It is a related advantageous effect of the invention that an acoustic absorber is provided that fits between the orifice plate and the charge plate.

Other advantageous effects of the invention will become apparent upon reference to the following Description of the Preferred Embodiments when read in light of the attached drawings.

DESCRIPTION OF THE PREFERRED EMBODIMENTS

The invention is described particularly in conjunction with ink jet printers of the continuous drop type. In addition, the invention is also applicable to any kind of ink jet printer that has a charge plate positioned adjacent to an orifice plate that receives vibrational energy to eject ink drops.

Figure 1:
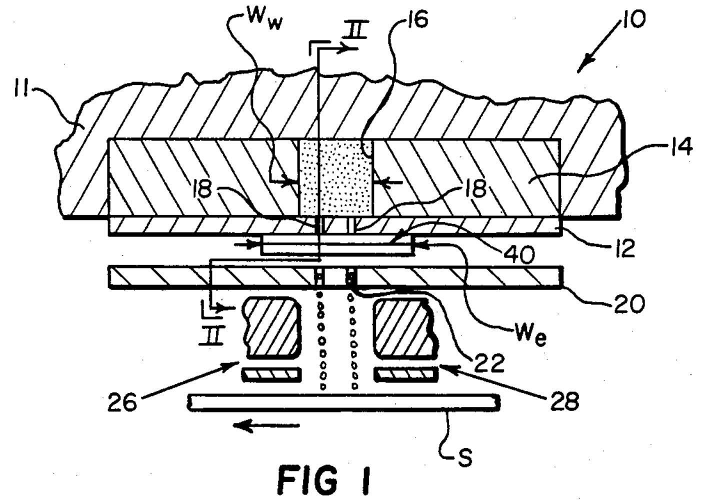
FIG. 1 is a fragmentary elevational view in section of a printer constructed in accordance with the invention.

Referring to FIG. 1, an ink jet printer 10 of the continuous drop type features an orifice plate 12 vibrated by a vibrating member (not shown) and a member 14 mounted in frame 11, having a waveguide cavity 16 that delivers ink to plate 12. Cavity 16 has opposite ends 17 and 19, FIG. 2. A multitude of orifices 18, usually in two parallel rows, is provided in plate 12, FIG. 1. It is the boundary of the bond of the cavity 16 to orifice plate 12 that constitutes the waveguide, since that bond boundary is the constraint on plate 12, and it is plate 12 that vibrates. That bond bondary has a width $w_w$, which for the embodiment shown remains constant for the full height of cavity 16. However, if cavity 16 is constructed so as to widen or become narrower at the top, then $w_w$ is measured only at the bottom of the cavity.

As is conventional with such printers, spaced from and exterior to member 14 and plate 12 is a charging means, not shown. Orifices 22 of an appropriate shape define the actual electrodes that charge the drops, their shape allowing the drops to pass through the fields emanating from the electrodes. Other electrode configurations are also useful, for example, those shown in U.S. Pat. No. 4,419,674 by Surinder Bahl et al. After the drops pass plate 20, they pass by catcher plates 26 and 28, if uncharged, or are caught by such plates, if charged. The uncharged drops then contact a paper sheet S passing underneath.

In accordance with the invention, an acoustic absorber 40 is disposed between plate 12 and plate 20, that is, outside of the ink drop generating means defined by plate 12 and member 14. The first component of the absorber is an elastomer sheet 42, which is preferably a generally flat sheet, positioned on plate 12. The sheet preferably has a durometer of about 80 on the A scale while its thickness is limited by the permissible space betwen orifice plate 12 and charge plate 20 to no more than about 4(t), where t is the vertical spacing between ejected drops. Therefore, as a practical matter sheet 42 has a thickness that is between about 380 and about 500 μm.

Several types of elastomers are useful to form sheet 42. For example, natural rubber and synthetic rubbers such as fluoro elastomers, and vinyl are useful.

An important aspect of sheet 42 is its ability to absorb the acoustic energy of plate 12. To accomplish this function, elastomer sheet 42 should have a width $w_e$, FIG. 1, that is at least twice the width $w_w$ of the waveguide 16. Because λ, the wavelength of the traveling wave, is a function of the width $w_w$ of waveguide 16, FIG. 1, $w_e$ is also a function of the value of λ. However, it is an inverse function, since the smaller the $w_w$ value, the larger the value of λ. There is a limit, however, to how narrow $w_w$ can be, because eventually λ becomes so large as to cause member 14 to become acoustically coupled to vibrating plate 12, which of course is undesirable. Conversely, $w_w$ can be enlarged only to the point that λ becomes so small that there is superimposed an asymmetric component onto the symmetric waveform. The result is distinct variations in the amplitude of the traveling wave across the length of the orifice plate. That is unsatisfactory because the amplitude of vibration across the orifice plate near the jets must be uniform.

As a practical matter, therefore, due to the limits confining the values of λ, $w_e$ is between about 1.3 cm and about 0.6 cm. In one example, $w_w$ was about 0.6 cm, so that $w_e$ was about 1.3 cm, and sheet 42 comprised Viton TM rubber, a fluoro elastomer, obtained from DuPont.

Figure 2:
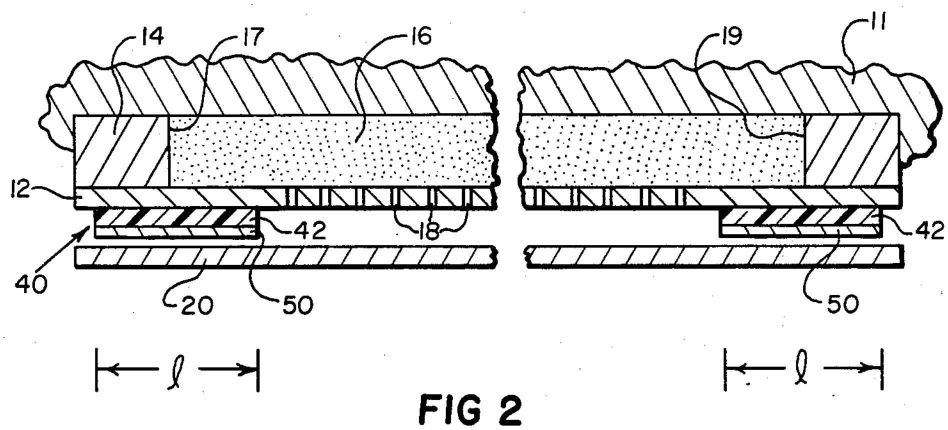
FIG. 2 is a fragmentary sectional view taken along the line II—II of FIG. 1.

To prevent traveling wave reflections from occurring at ends 17 and 19 of waveguide 16, acoustic absorber 40 is disposed so as to be under waveguide 16 at at least those ends, and to extend beyond such ends to provide a length 1 that is at least twice the value of λ. At its upper limit, "1" is limited only in that acoustic absorber 40 is constructed so as to not extend directly under orifices 18, as such would impede the formation and ejection of ink drops. "1" is preferably between about 2λ and about 4λ. Thus, preferably absorber 40 is constructed to comprise two pieces, as shown in FIG. 2, each with a length 1. Alternatively, it can comprise a single piece with an aperture cut out along its long axis to provide for passage of the jets.

Sheet 42 can be secured to plate 12 by any suitable means, for example, adhesive. Or it can, in the case of a rubber, be vulcanized directly in place.

The second component of the acoustic absorber is a diffuser 50 disposed between sheet 42 and charge plate 20. The function of the diffuser is to distribute the vibrations absorbed by sheet 42, over the entire surface of sheet 42. Therefore, diffuser 50 should have an acoustic impedance of at least $3\times10^7$ kg/m$^2$ sec, to provide that function. It also preferably has the same surface dimensions as elastomer sheet 42, so as to permit sheet 42 to be exactly covered by diffuser 50.

Suitable materials providing these characteristics to the diffuser include any metal, for example, steel, copper, and tin sheets.

Preferably, diffuser 50 has a thickness that is between about 0.002 cm and about 0.005 cm.

Because of the acoustically active nature of diffuser 50, it should be spaced from and not in contact with charge plate 20.

The invention has been described in detail with particular reference to preferred embodiments thereof, but it will be understood that variations and modifications can be effected within the spirit and scope of the invention.

What is claimed is:

1. In an ink jet printer comprising an orifice plate having a waveguide, a charge plate, and an acoustic absorbing means for preventing acoustic reflections from being generated at the ends of the waveguide, the improvement wherein said acoustic absorbing means comprises (a) a sheet of elastomer disposed outside of and on said orifice plate in a position between said orifice plate and said charge plate, and (b) a diffuser disposed between said elastomer sheet and said charge plate, in contact with said elastomer sheet but not with said orifice plate, said diffuser having an acoustic impedance of at least $3\times10^7$ kg/m$^2$ sec, said elastomer sheet and said diffuser both having a width and a length that are sufficient to cause said absorbing means to absorb said vibrations and prevent internal reflections from occurring at the ends of said waveguide.

2. An ink jet printer as defined in claim 1, wherein said elastomer is a fluoro elastomer, and said diffuser comprises a copper sheet.

3. An ink jet printer as defined in claim 2, wherein said acoustic absorber is in two pieces, each of which underlies an end of said waveguide to prevent reflections, each said piece having a width of between about 63 cm and about 0.6 cm, a thickness between about 0.002 cm and about 0.005 cm, and a length of at least about 2λ wherein λ is the wavelength of the traveling wave that occurs along said orifice plate.

* * * * *